US009722207B2

(12) United States Patent
Lee

(10) Patent No.: US 9,722,207 B2
(45) Date of Patent: Aug. 1, 2017

(54) ORGANIC LIGHT-EMITTING DISPLAY DEVICE

(71) Applicant: LG DISPLAY CO., LTD., Seoul (KR)

(72) Inventor: Sohee Lee, Suwon-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/198,672

(22) Filed: Jun. 30, 2016

(65) Prior Publication Data
US 2017/0047550 A1    Feb. 16, 2017

(30) Foreign Application Priority Data
Aug. 10, 2015   (KR) .................. 10-2015-0112391

(51) Int. Cl.
| | | |
|---|---|---|
| H01L 29/08 | (2006.01) | |
| H01L 29/06 | (2006.01) | |
| H01L 27/14 | (2006.01) | |
| H01L 27/15 | (2006.01) | |
| H01L 51/52 | (2006.01) | |
| H01L 51/50 | (2006.01) | |
| H01L 27/32 | (2006.01) | |
| G09G 3/3266 | (2016.01) | |
| G09G 3/3258 | (2016.01) | |
| G09G 3/20 | (2006.01) | |

(52) U.S. Cl.
CPC ....... H01L 51/5265 (2013.01); G09G 3/2074 (2013.01); G09G 3/3258 (2013.01); G09G 3/3266 (2013.01); H01L 27/3211 (2013.01); H01L 27/3244 (2013.01); H01L 51/5004 (2013.01); H01L 51/5056 (2013.01); H01L 51/5206 (2013.01); H01L 51/5221 (2013.01); G09G 2300/0452 (2013.01); G09G 2300/0819 (2013.01); G09G 2320/0242 (2013.01); H01L 2251/552 (2013.01); H01L 2251/558 (2013.01)

(58) Field of Classification Search
CPC ............ H01L 51/5265; H01L 51/5004; H01L 51/5056; H01L 51/5206; H01L 51/5221
USPC ............... 257/40, 13, 72, 79, 98; 438/23, 29
See application file for complete search history.

(56) References Cited

U.S. PATENT DOCUMENTS

| | | | |
|---|---|---|---|
| 2007/0120476 A1* | 5/2007 | Park ................... | H01L 27/1214 313/506 |
| 2008/0142807 A1* | 6/2008 | Choe .................. | H01L 51/5225 257/72 |

(Continued)

*Primary Examiner* — Dzung Tran
(74) *Attorney, Agent, or Firm* — Birch, Stewart, Kolasch & Birch, LLP

(57) ABSTRACT

Provided is a display device, including two light-emitting elements having different turn-on voltages. Each of the light-emitting elements includes a patterned electrode, a common layer, a patterned light-emitting layer, and a common electrode. The light-emitting element with the lower turn-on voltage among the two light-emitting elements includes a functional layer which suppresses a hole from being leaked from the light-emitting layer with the higher turn-on voltage through the common layer when the light-emitting element with the higher turn-on voltage among the two light-emitting elements is driven at a low gray scale to move into the patterned light-emitting layer of the light-emitting element with the lower turn-on voltage. Therefore, the light emission of an undesired pixel due to the leakage current is reduced, thereby improving the display quality.

20 Claims, 9 Drawing Sheets

(56) References Cited

U.S. PATENT DOCUMENTS

2009/0061720 A1* 3/2009 Fujimaki ................ H01L 51/56
 445/2
2013/0334507 A1* 12/2013 Shimoji ................ F21V 9/08
 257/40
2014/0361260 A1* 12/2014 Kim ................ H01L 27/3246
 257/40

* cited by examiner

|  | CTL | Turn-on Voltage | $\triangle$V |
|---|---|---|---|
| COMPARATIVE EMBODIMENT | X | 2.07V | 0 |
| EXEMPLARY EMBODIMENT | 200Å | 2.87V | +0.8V |

FIG. 6A

ORGANIC LIGHT-EMITTING DISPLAY DEVICE

CROSS-REFERENCE TO RELATED APPLICATIONS

This application claims the priority of Korean Patent Application No. 10-2015-0112391 filed on Aug. 10, 2015, in the Korean Intellectual Property Office, the disclosure of which is incorporated herein by reference.

BACKGROUND OF THE INVENTION

Field of the Invention

The present disclosure relates to an organic light-emitting display device, and more particularly, to an organic light-emitting display device which suppresses a current leaked through a common layer shared by a plurality of light-emitting elements, from flowing into an adjacent light-emitting element, to improve a display quality.

Description of the Related Art

An organic light-emitting display device (OLED device) is the next-generation display apparatus having a self-luminance characteristic. Unlike a liquid crystal display device, the organic light-emitting display device does not need a separate light source. Thus, the organic light emitting device may be manufactured into a lightweight and thin form. Further, the OLED device is advantageous in terms of a viewing angle, a contrast ratio, a response speed, and power consumption, as compared with a liquid crystal display apparatus. Therefore, the OLED apparatus is getting the spotlight as the next-generation display apparatus.

SUMMARY

Specifically, the organic light-emitting display device is a display device in which holes and electrons injected from two electrodes are recoupled to each other in a light-emitting layer to form excitons and light having a specific wavelength is generated by emitting energy of the excitons. Further, the organic light-emitting display device has a self-luminance characteristic.

The organic light-emitting display device may have a patterned light-emitting layer structure.

The organic light-emitting display device having a patterned light-emitting layer structure may have a structure in which light-emitting layers emit different color light, that is, red, blue, and green light-emitting layers are separated for every pixel between two electrodes. A pattern of each of the light-emitting layers may be deposited using a mask which is open for every pixel, for example, a fine metal mask (FMM).

Organic layers, such as an injecting layer or a transporting layer, which improve characteristics of the light-emitting elements such as a driving voltage or light emission efficiency may be further disposed between two electrodes. Further, each pixel may have different lamination structures in consideration of a characteristic of the light-emitting layers which are patterned for every pixel, in consideration of wavelengths, materials, and the like.

In the organic light-emitting display device having a patterned light-emitting layer structure, at least some of organic layers, except the light-emitting layer among organic layers provided between two electrodes, may have a common structure.

Here, the layers having the common structure may be formed by using a common mask in which all pixels are open. The layers having the common structure may be laminated with the same structure in all the pixels without having a separate pattern for every pixel. That is, a layer having the common structure is disposed to be connected or extend from one pixel to an adjacent pixel thereto without having a disconnected portion so that the layer is shared by a plurality of pixels. The layer having the common structure may be referred to as a common layer or a common structured layer.

However, if an organic layer is formed to have a common structure and shared by the plurality of pixels, when the organic light-emitting display device is driven, some currents are leaked through the organic layer having a common structure. Therefore, not only the driving pixel, but also adjacent pixels unnecessarily emit light. Therefore, unexpected pixels unnecessarily emit light to cause color mixture between pixels, which results in lowered display quality of the organic light-emitting display device.

Specifically, the inventor of the present disclosure found that the color mixture between pixels due to leaked current is more serious depending on a difference of turn-on voltages of adjacent pixels at the time of low gray scale driving, that is, at an initial time when a voltage between two electrodes exceeds a turn-on voltage. This will be described in detail below.

A turn-on voltage refers to a driving voltage between two electrodes applied at a timing defined that one pixel emits light.

As described above, in the organic light-emitting display device having a patterned light-emitting layer structure, lamination structures of organic layers may vary at every pixel depending on characteristics of the light-emitting layers. The turn-on voltage of the pixel may vary in accordance with a characteristic of the light-emitting layer or a lamination structure of the organic layer.

In a structure in which turn-on voltages of adjacent pixels are different from each other, when a pixel having a higher turn-on voltage is driven, a pixel having a lower turn-on voltage which is adjacent thereto may be significantly affected. A voltage applied to the pixel with a higher turn-on voltage is high, thus an amount of current leaked through the organic layer having a common structure also increases. Further, the current flowing into the organic layer having a common structure is easily leaked to the pixel having a lower turn-on voltage which is considered to have a lower barrier through which the current flows.

Moreover, when one pixel is driven at a low gray scale, the brightness of the driving pixel is low. Therefore, when light is unnecessarily emitted from the adjacent pixels, the color mixture of the light may be more easily noticed by a user. That is, at an initial time when the driving voltage applied between two electrodes exceeds a turn-on voltage, the color mixture between adjacent pixels may be more significantly noticed.

On the contrary, when a pixel with a relatively low turn-on voltage is driven, a pixel with a relatively high turn-on voltage and located adjacent thereto may be relatively less affected. This is because the applied voltage is too low to drive the adjacent pixel with a higher turn-on voltage and the current flowing into an organic layer having a common structure is relatively low so that an amount of leaked current is also reduced. Further, the current flowing into an organic layer having a common structure flows into a pixel with a lower turn-on voltage more easily than into a pixel with a higher turn-on voltage which is considered to have a relatively high barrier through which the current flows. Therefore, the current leaked into the pixel with a higher turn-on voltage may be reduced.

Further, when one pixel is driven at a relatively high gray scale, a high voltage which is much higher than the turn-on voltage is applied to the pixel so that a large amount of current flows. Therefore, a brightness of the driving pixel is increased. Therefore, even though some of the currents are leaked into an adjacent pixel, the viewer may barely notice. Therefore, the color mixture due to the leaked current may be more seriously noticed at a low gray scale.

In light of above, the inventor of the present disclosure recognized the above-mentioned problems and conceived an improved structure that allows a light-emitting element with a lower turn-on voltage of the two light-emitting elements with different turn-on voltages, which is achieved by including a functional layer which effectively suppresses the current leakage from the adjacent pixel through a common layer. Therefore, the inventor invented a new organic light-emitting display device in which a color mixture problem between adjacent pixels due to leaked current is sufficiently resolved.

Therefore, an object of an exemplary embodiment of the present disclosure is to provide an organic light-emitting display device in which a light-emitting element with a lower turn-on voltage of the two adjacent light-emitting elements includes a functional layer which suppresses holes of a light-emitting element with a higher turn-on voltage from being leaked through a common layer to flow (or move) into the light-emitting element with a lower turn-on voltage relatively, thereby minimizing a leaked current flowing into adjacent pixels to reduce color mixture between adjacent elements due to the leaked current.

Objects according to an exemplary embodiment of the present disclosure are not limited to the above-mentioned objects, and other objects, which are not mentioned above, can be clearly understood by those skilled in the art from the following descriptions.

According to an aspect of the present disclosure, there is provided a display device. The display device includes two light-emitting elements with different turn-on voltages. Herein, each of two light-emitting elements includes a patterned electrode, a common layer, a patterned light-emitting layer, and a common electrode. A light-emitting element with a lower turn-on voltage of the two light-emitting elements includes a functional layer suppressing a hole from being leaked from a light-emitting layer with a higher turn-on voltage through the common layer and moved into the patterned light-emitting layer of the light-emitting element with the lower turn-on voltage, when the light-emitting element with the higher turn-on voltage of the two light-emitting elements is driven at a low gray scale. Therefore, the emission of an undesired pixel due to the leakage current is reduced, which results in improving a display quality.

According to another aspect of the present disclosure, there is provided an organic light-emitting display device. The organic light-emitting display device including a first pixel and a second pixel which are adjacent to each other includes a plurality of first electrodes which corresponds to the first pixel and the second pixel and is spaced apart from each other, a common hole transporting layer which extends onto the plurality of first electrodes, a first patterned light-emitting layer on the common hole transporting layer corresponding to the first pixel, a second patterned light-emitting layer on the common hole transporting layer corresponding to the second pixel with a HOMO level lower than that of the first patterned light-emitting layer, a patterned hole transporting layer between the common hole transporting layer and the first patterned light-emitting layer corresponding to the first pixel, a functional layer between the patterned hole transporting layer and the first patterned light-emitting layer corresponding to the first pixel with a HOMO level lower than that of the patterned hole transporting layer, and a second electrode on the first patterned light-emitting layer and the second patterned light-emitting layer. According to another exemplary embodiment of the present disclosure, the organic light-emitting display device is configured to include the functional layer having a HOMO level which is lower than that of the patterned hole transporting layer, thereby resolving the color mixture problem between adjacent pixels due to the leaked current.

A functional layer which is in contact with a common layer is provided in a light-emitting element with a lower turn-on voltage of the two light-emitting elements. Therefore, when a pixel is driven at a low gray scale, a hole of a light-emitting element with a higher turn-on voltage is suppressed from being leaked through the common layer to flow into the light-emitting element with a relatively low turn-on voltage. Therefore, a color mixture problem between adjacent pixels is solved, which results in improving a display quality of an organic light emitting display device.

A highest occupied molecular orbital (HOMO) level of a functional layer included in a light-emitting element with a relatively low turn-on voltage is lower than a HOMO level of a patterned hole transporting layer which is in contact with an upper portion of the functional layer. Therefore, a hole which is leaked through a common hole transporting layer which is in contact with a lower portion of the functional layer is suppressed from flowing into the light-emitting layer of the light-emitting element with a relatively low turn-on voltage. Therefore, emission of an unexpected pixel is reduced, so that a color mixture problem between adjacent pixels is resolved.

A thickness of the functional layer is a thickness obtained by considering a micro-cavity distance between two electrodes, so that an optical efficiency and a lifespan of the organic light-emitting display device is improved.

The effects of the present disclosure are not limited to the aforementioned effects, and other effects, which are not mentioned above, will be apparent to a person having ordinary skill in the art from the following description.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which:

FIGS. 6A and 6B are a table and a graph illustrating a turn-on voltage according to a comparative embodiment and an exemplary embodiment of the present disclosure.

DETAILED DESCRIPTION OF THE EMBODIMENTS

Figure 1:
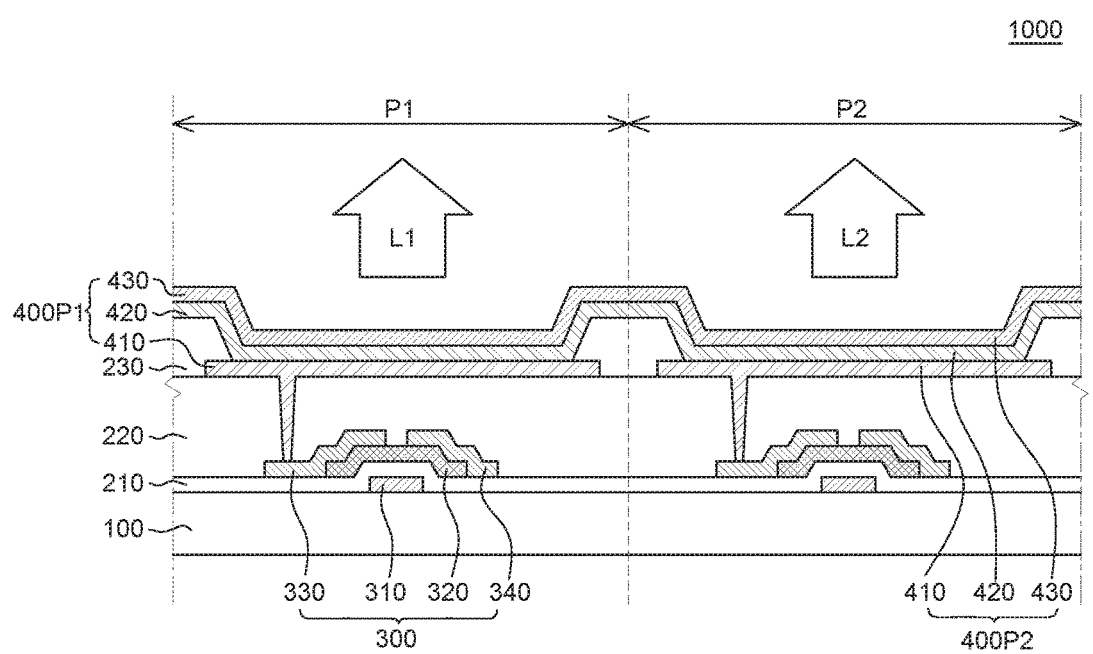
FIG. 1 is a cross-sectional view of a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals indicate like elements throughout the specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways by those skilled in the art, and the embodiments can be carried out independently of or in association with each other.

Hereinafter, exemplary embodiments of the present disclosure will be described in detail with reference to the accompanying drawings as follows.

FIG. 1 is a cross-sectional view of a display device 1000 according to an exemplary embodiment of the present disclosure.

Referring to FIG. 1, the display device 1000 includes a plurality of pixels P1 and P2 which are adjacent to each other. A pixel refers to a minimum unit of an area where the light is actually emitted and may be also referred to as a sub pixel or a pixel area. Further, a plurality of pixels may form a minimum group which expresses white light. For example, three pixels of a red pixel, a green pixel, and a blue pixel form one group. However, the present disclosure is not limited thereto and various pixel designs may be allowed. In FIG. 1, for the convenience of description, only two pixels P1 and P2 which are adjacent to each other and emit only first color light L1 and second color light L2 are illustrated.

As illustrated in FIG. 1, the display device 1000 includes a thin film transistor 300 and a light-emitting element 400 for every pixel. The thin film transistor 300 is disposed on a substrate 100 and supplies signals to the light-emitting element 400. The thin film transistor 300 illustrated in FIG. 1 may be a driving thin film transistor connected to a first electrode 410 of the light-emitting element 400. Each pixel P1 and P2 may further include a switching thin film transistor and/or a capacitor which drives the light-emitting element 400.

The substrate 100 may be formed of an insulating material. For example, the substrate 100 may be formed of a flexible film formed of a glass or a polyimide based material.

The thin film transistor 300 includes a gate electrode 310, an active layer 320, a source electrode 330, and a drain electrode 340. Referring to FIG. 1, the gate electrode 310 is formed on the substrate 100 and a gate insulating layer 210 covers the gate electrode 310. The active layer 320 is disposed on the gate insulating layer 210 to overlap the gate electrode 310. The source electrode 330 and the drain electrode 340 are disposed on the active layer 320 to be spaced apart from each other.

In the present disclosure, when two elements or objects overlap, it can mean that at least parts of the two objects overlap regardless of whether another object is present between the two objects in a vertical relationship. The overlapping of two objects may be represented by various terms.

The gate electrode 310, the source electrode 330, and the drain electrode 340 are formed of a conductive material. For example, the electrodes may be formed of any one of molybdenum (Mo), aluminum (Al), chrome (Cr), gold (Au), titanium (Ti), nickel (Ni), neodymium (Nd), and copper (Cu) or an alloy thereof. However, the material is not limited thereto but may include various materials.

The active layer 320 may be formed of amorphous silicon (a-Si), polycrystalline silicon (poly-Si), oxide, and/or organic materials depending on a type of the active layer, but is not limited thereto.

The gate insulating layer 210 may be configured by a single layer or a plurality of layers formed of an inorganic material and may be formed of silicon oxide (SiOx) or silicon nitride (SiNx).

In FIG. 1, the thin film transistor 300 is illustrated to have a staggered structure, but is not limited thereto. The thin film transistor 300 may be formed to have a coplanar structure or other types of configurations.

A flattening layer 220 is disposed on the thin film transistor 300 to partially expose the source electrode 330. The flattening layer 220 may be configured by a single layer or a plurality of layers and may be formed of an organic material. Specifically, the flattening layer 220 may be formed of polyimide, acryl, or the like.

Further, a passivation layer may be further formed between the flattening layer 220 and the thin film transistor 300. The passivation layer is formed of an inorganic material and protects the thin film transistor 300 and partially exposes the source electrode 330, which is similar to the flattening layer 220.

The light-emitting element 400 is disposed on the flattening layer 220 and includes a first electrode 410, a light-emitting unit 420, and a second electrode 430. The display device 1000 according to the exemplary embodiment of the present disclosure employs a top emission method so that light from the light-emitting unit 420 passes through the second electrode 430 to be upwardly emitted. Further, as illustrated in FIG. 1, a first light-emitting element 400P1 of the display device 1000 is located in a first pixel P1 and a second light-emitting element 400P2 is located in a second pixel P2. The first pixel P1 and the second pixel P2 emit first color light L1 and second color light L2, respectively and the first color light L1 and the second color light L2 represent different colors. A specific structure of the light-emitting elements 400 disposed in adjacent two pixels P1 and P2 will be described with reference to FIG. 2.

Figure 2:
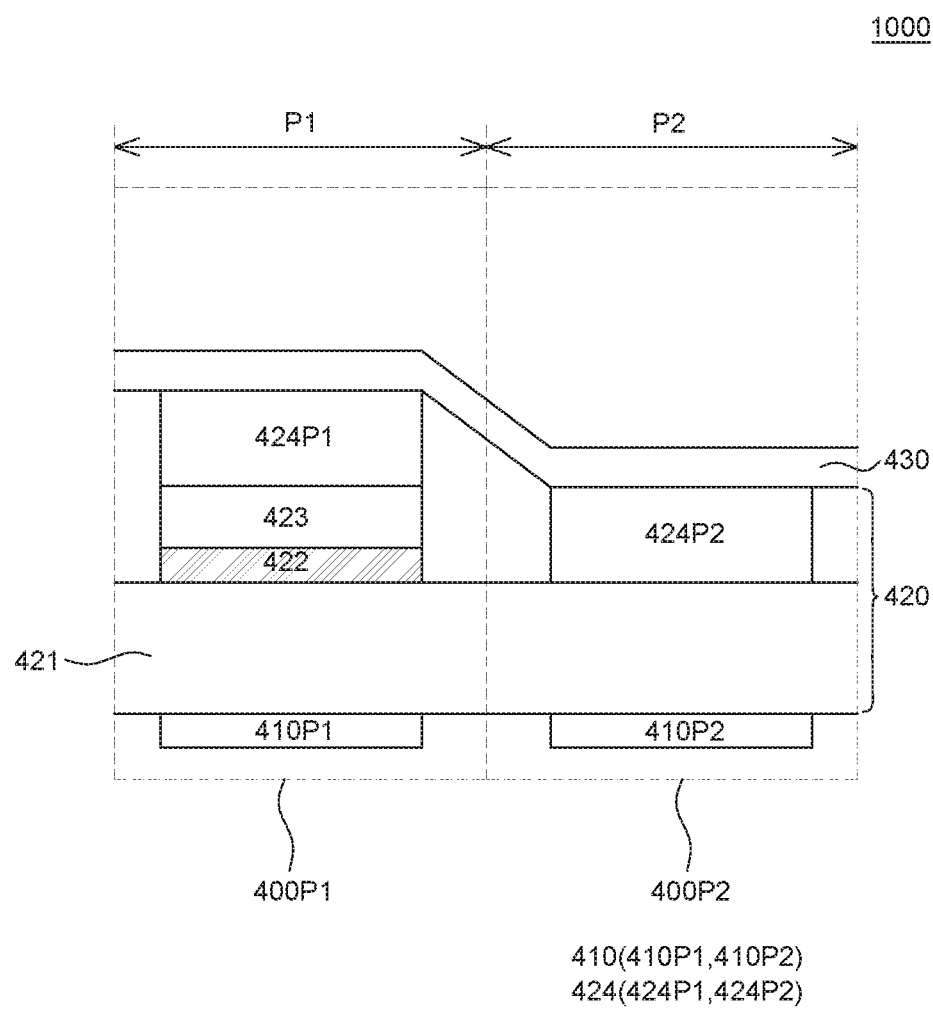
FIG. 2 is a cross-sectional view illustrating components of a display device according to an exemplary embodiment of the present disclosure.

FIG. 2 is a cross-sectional view illustrating components of a display device 1000 according to an exemplary embodiment of the present disclosure. More specifically, FIG. 2 is a schematic cross-sectional view explaining components of two light-emitting elements 400P1 and 400P2 located in adjacent two pixels P1 and P2 of the display device 1000, respectively.

Referring to FIG. 2, the first light-emitting element 400P1 corresponding to the first pixel P1 includes the first electrode 410P1, a second electrode 430, and a first light-emitting unit 420 including a common hole transporting layer 421, a functional layer 422, a patterned hole transporting layer 423, and a first patterned light-emitting layer 424P1. The second light-emitting element 400P2 corresponding to the second pixel P2 includes a first electrode 410P2, a second electrode 430, and a first light-emitting unit 420 including a common hole transporting layer 421 and a second patterned light-emitting layer 424P2. Here, the light-emitting unit 420 may refer to all organic layers or structures of all organic layers located between the first electrode 410P1 and the second electrode 430 in each pixel P1 and P2.

A plurality of first electrodes 410P1 and 410P2 correspond to the first pixel P1 and the second pixel P2, respectively to be disposed to be spaced apart from each other. A plurality of first electrodes 410P1 and 410P2 is electrodes which supply holes to the patterned light-emitting layers 424P1 and 424P2 of the light-emitting unit 420 and is connected to the source electrode 330 of the thin film transistor 300. The plurality of first electrodes 410P1 and 410P2 may be referred to as anodes or pattern electrodes.

Further, the first electrode 410 may be connected to the drain electrode 340 depending on the type of the thin film transistor 300. Further, the display device 1000 of the present disclosure employs an upper emission method. Therefore, each of the plurality of first electrodes 410P1 and 410P2 may include a reflective layer, respectively. For example, the first electrode 410 may have a dual layered structure in which a transparent layer and the reflective layer are alternately laminated or a triple (or multiple) layered structure in which a transparent layer, a reflective layer and a transparent layer are alternately laminated. The transparent layer may be formed of a transparent conductive oxide (TCO) material such as indium tin oxide (ITO) or indium zinc oxide (IZO). The reflective layer may be formed of a metal material such as copper (Cu), silver (Ag), or palladium (Pd).

The second electrode 430 is commonly disposed over a plurality of pixels P1 and P2 and supplies electrons to the light-emitting layers 424P1 and 424P2 of the light-emitting unit 420. Since the light of the light-emitting unit 420 needs to pass through the second electrode 430, the second electrode 430 may be formed of a metal material having a very small thickness, for example, 150 Å or larger and 250 Å or smaller or a transparent material. The second electrode 430 may be formed of silver (Ag), magnesium (Mg), indium zinc oxide (IZO), indium tin oxide (ITO), or the like. The second electrode 430 may be referred to as a cathode or a common electrode.

The common hole transporting layer 421 may be disposed on the plurality of first electrodes 410P1 and 410P2 over the plurality of pixels P1 and P2. The common hole transporting layer 421 smoothly transfers the holes injected from the first electrode 410 to a first patterned light-emitting layer 424P1 or a second patterned light-emitting layer 424P2. The common hole transporting layer 421 may be formed of TPD (N,N'-diphenyl-N,N'-bis(3-methylphenyl)-1,1'-bi-phenyl-4,4'-diamine) or NPB (N,N'-di(naphthalen-1-yl)-N,N'-diphenyl-benzidine), but is not necessarily limited thereto.

The common hole transporting layer 421 has a common structure and extends onto the plurality of first electrodes 410P1 and 410P2, respectively, corresponding to the first pixel P1 and the second pixel P2. The common hole transporting layer 421 having the common structure may be formed using a common mask in which all pixels are open. The layers having the common structure may be laminated with the same structure in all the pixels without having a separated pattern for every pixel. That is, the common hole transporting layer 421 is disposed to be connected or extend from one pixel to an adjacent pixel thereto without having a disconnected portion so that the common hole transporting layer 421 is shared by a plurality of pixels. The common hole transporting layer 421 may also be referred to as a common layer or a common structured layer.

Two light-emitting elements 400P1 and 400P2 of the display device 1000 according to the exemplary embodiment of the present disclosure have patterned light-emitting layer structure. More specifically, the patterned light-emitting layers 424P1 and 424P2 disposed between the common hole transporting layer 421 and the second electrode 430 are configured by a patterned structure which are divided for every pixel P1 and P2.

The first patterned light-emitting layer 424P1 corresponding to the first pixel P1 and the second patterned light-emitting layer 424P2 corresponding to the second pixel P2 emit different color light and may have a separated structure for each of the pixels P1 and P2. A pattern of each of the patterned light-emitting layers 424P1 and 424P2 may be deposited using a mask which is open for every pixel, for example, a fine metal mask (FMM).

The light-emitting elements 400P1 and 400P2 may be formed of light-emitting units 420 having different lamination structures for each of pixels P1 and P2, in consideration of characteristic of the patterned light-emitting layers 424P1 and 424P2 disposed for every pixel P1 and P2, for example, a wavelength of emitted light or a material. More specifically, the light-emitting unit 420 of the first light-emitting element 400P1 may have a structure and a thickness obtained by considering a micro-cavity distance between the first electrode 410P1 and the second electrode 430 in accordance with a wavelength of light emitted by the first patterned light-emitting layer 424P1. The micro-cavity refers that light emitted from the patterned light-emitting layers 424P1 and 424P2 is repeatedly reflected and re-reflected between two electrodes 410 and 430 to be amplified so that constructive interference occurs, thereby improving light emission efficiency. Further, when the first electrode 410 is formed of a transparent conductive layer such as ITO or IZO and a reflective layer of a metal material, a distance from a top surface of the reflective layer to a bottom surface of the second electrode 430 may be a micro-cavity distance between the first electrode 410 and the second electrode 430.

Referring to FIG. 2, in a structure in that a wavelength of light emitted from the first patterned light-emitting layer 424P1 is higher than that of the light emitted from the second patterned light-emitting layer 424P2, the light-emitting unit 420 of the first light-emitting element 400P1 includes a patterned hole transporting layer 423 corresponding to the first pixel P1 between the first patterned light-emitting layer 424P1 and the common hole transporting layer 421. Therefore, the micro-cavity distance between two electrodes 410P1 and 430 may be optimized.

The patterned hole transporting layer 423 functions not only to optimize the micro-cavity distance of the first light-emitting element 400P1, but also to transfer smoothly the holes injected from the first electrode 410P1 of the first light-emitting element 400P1 to the first patterned light-emitting layer 424P1. The patterned hole transporting layer 423 may be formed of TPD (N,N'-diphenyl-N,N'-bis(3-methylphenyl)-1,1'-bi-phenyl-4,4'-diamine) or NPB (N,N'-di(naphthalen-1-yl)-N,N'-diphenyl-benzidine), but is not necessarily limited thereto. Further, the patterned hole transporting layer 423 and the common hole transporting layer 421 may be formed of the same material. The patterned hole transporting layer 423 may also be referred to as a patterned layer or a patterned structure layer.

In the display device 1000 according to the exemplary embodiment of the present disclosure, turn-on voltages of the two light-emitting elements 400P1 and 400P2 may have different from each other depending on a lamination structure of the light-emitting unit 420 for every pixel P1 and P2 or a characteristic of the patterned light-emitting layers 424P1 and 424P2. A turn-on voltage refers to a driving voltage between two electrodes applied at a timing defined that one pixel emits light.

As mentioned above, in a structure in which turn-on voltages of two adjacent pixels are different from each other, when a pixel with a higher turn-on voltage of the two pixels is driven, another pixel which is adjacent thereto, that is, light may be undesirably emitted from the pixel with a relatively low turn-on voltage. Specifically, a voltage applied to the pixel with a higher turn-on voltage is high, so that an amount of current leaked through the common layer is also increased. Further, the current flowing into the common layer may be easily leaked to the pixel with a lower turn-on voltage. In this case, the pixel with a lower turn-on voltage is considered that a barrier through which the current may flow is lower. By doing this, an undesired pixel emits light so that a color mixture problem between adjacent pixels may occur.

In the display device 1000 according to the exemplary embodiment of the present disclosure, the light-emitting element with a relatively low turn-on voltage includes a functional layer 422. The functional layer 422 suppresses the current of the light-emitting element with a higher turn-on voltage from being leaked through the common layer, to flow (or move) the current into a light-emitting layer of a light-emitting element with a lower turn-on voltage. The functional layer 422 has a patterned structure disposed to correspond to the first pixel P1 in a position which is in contact with the common layer. The functional layer 422 suppresses the current leaked through the common layer from flowing (or moving) into the patterned light-emitting layer of the light emitting element with a lower turn-on voltage, by optimizing an energy level of the functional layer 422 in consideration of another surrounding organic layer. This will be described in more detail with reference to FIGS. 3A and 3B.

Figure 3A:
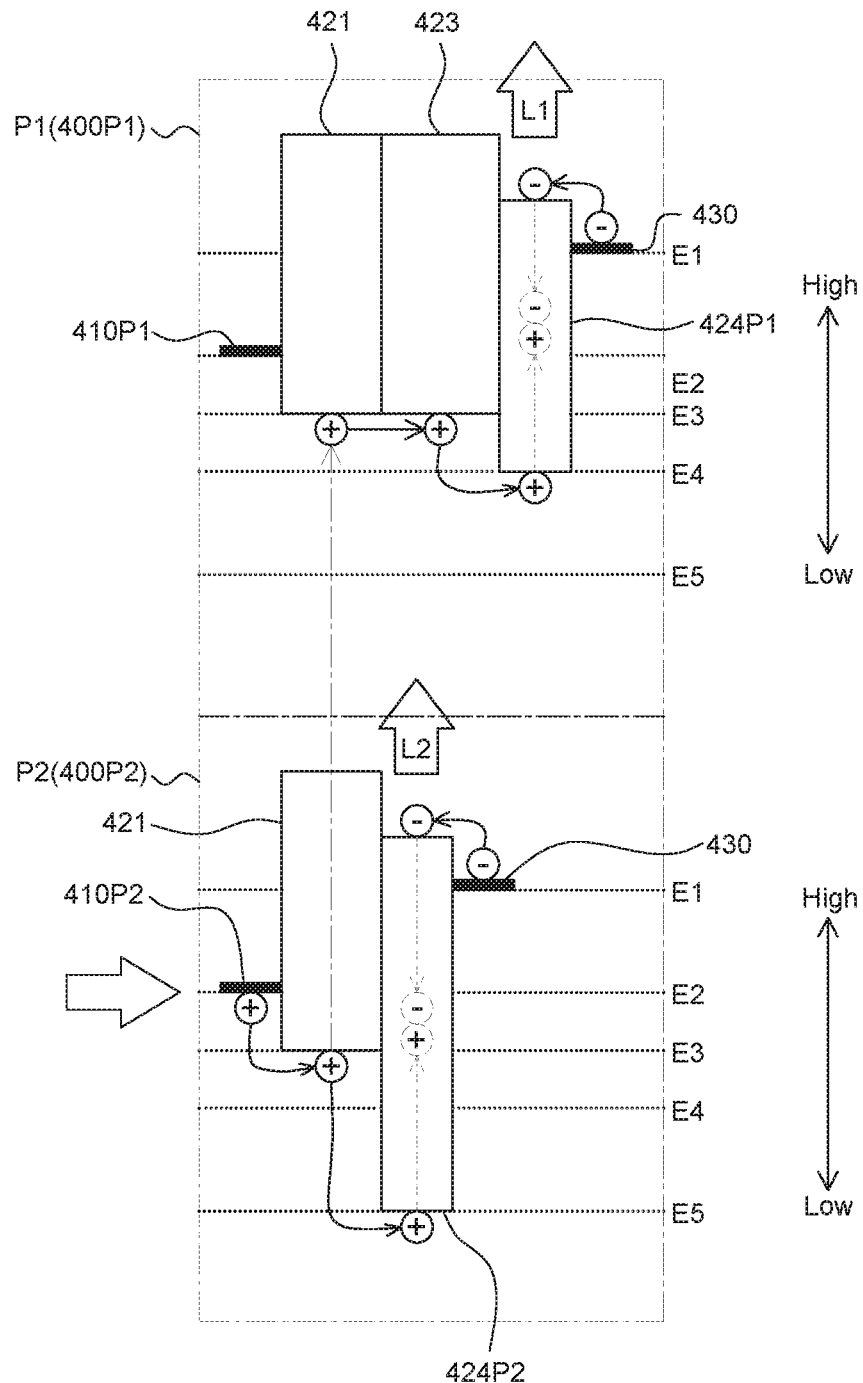
FIGS. 3A and 3B are views illustrating an energy band diagram of a light-emitting element to explain flow of a hole and an electron depending on whether to provide a functional layer.
Figure 3B:
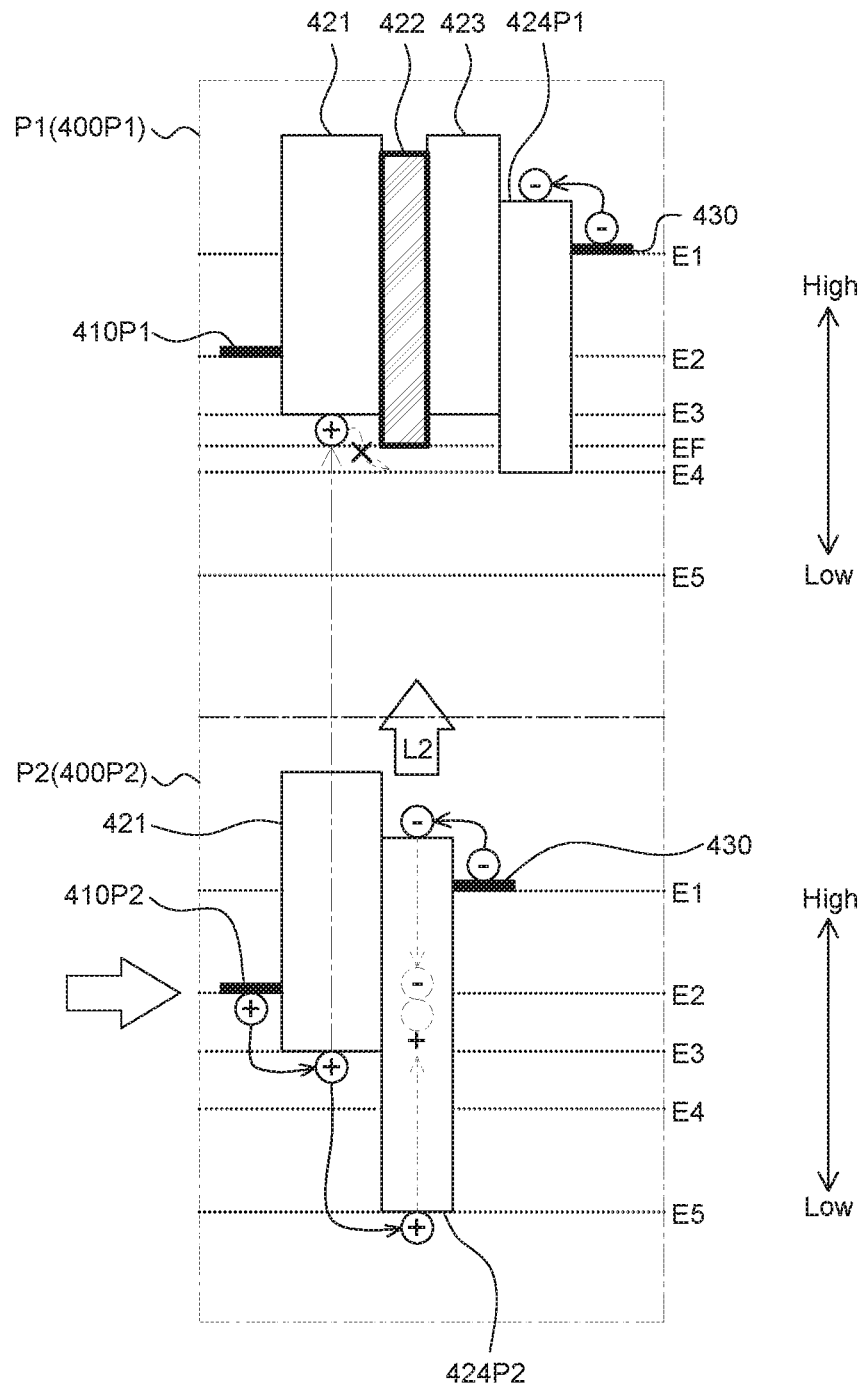

FIGS. 3A and 3B are views illustrating an energy band diagram of a light-emitting element to explain flow of holes and electrons depending on whether to provide a functional layer.

FIG. 3A illustrates an energy band diagram illustrating flow of holes and electrons in a structure in which the first light-emitting element 400P1 does not include a functional layer.

The first light-emitting element 400P1 and the second light-emitting element 400P2 have light-emitting units 420 with different lamination structures in accordance with characteristics of the patterned light-emitting layers 424P1 and 424P2. Therefore, the turn-on voltages of the first light-emitting element 400P1 and the second light-emitting element 400P2 are different from each other.

Referring to FIG. 3A, in a structure in which the first light-emitting element 400P1 and the second light-emitting element 400P2 are adjacent to each other, when a voltage is applied to the first electrode 410P2 of the second light-emitting element 400P2, holes of the first electrode 410P2 are injected into the common hole transporting layer 421. The holes which are injected into the common hole transporting layer 421 are transferred to the second patterned light-emitting layer 424P2. Further, in the second patterned light emitting layer 424P2, the hole transferred through the common hole transporting layer 421 and the electron injected from the second electrode 430 are coupled to emit second light L2.

In this case, some of the holes which are injected from the first electrode 410P2 of the second light-emitting element 400P2 into the common hole transporting layer 421 may be leaked to the first light-emitting element 400P1 of the first pixel P1 which is adjacent thereto along the common hole transporting layer 421, as illustrated in FIG. 3A. This will be described in more detail below.

As mentioned above, light emitted from the first patterned light-emitting layer 424P1 has a higher wavelength than that of light emitted from the second patterned light-emitting layer 424P2. Therefore, the first patterned light-emitting layer 424P1 and the second patterned light-emitting layer 424P2 may be formed of different materials in accordance with the wavelengths of emitted light. Accordingly, as illustrated in FIG. 3A, in accordance with the characteristics of the materials, a highest occupied molecular orbital (HOMO) level E4 of the first patterned light-emitting layer 424P1 may be higher than a HOMO level E5 of the second patterned light-emitting layer 424P2.

Here, the HOMO level refers to a molecular orbital function of an electron which is in an area having a highest energy among areas where electrons participate in coupling. Further, since the HOMO level typically has a negative value, a value is gradually decreased from E1 to E2, but an absolute value thereof is gradually increased.

Further, the patterned hole transporting layer 423 disposed between the first patterned light-emitting layer 424P1 and the common hole transporting layer 421 may have a HOMO level value between a HOMO level E4 of the first patterned light-emitting layer 424P1 and a HOMO level E3 of the common hole transporting layer 421. For example, when the patterned hole transporting layer 423 is formed of the same material as the common hole transporting layer 421, as illustrated in FIG. 3A, the HOMO levels of the patterned hole transporting layer 423 and the common hole transporting layer 421 have the same value E3.

Flow of the holes which are leaked to the common hole transporting layer 421 may be adjusted in accordance with a HOMO level difference from a layer which is in contact with the common hole transporting layer 421. That is, as illustrated in FIG. 3A, a difference between the HOMO level E3 of the common hole transporting layer 421 and the HOMO level E3 of the patterned hole transporting layer 423 in the first light-emitting element 400P1 is lower than a difference between the HOMO level E3 of the common hole transporting layer 421 and the HOMO level E5 of the second patterned light-emitting layer 424P2 in the second light-emitting element 400P2. In this case, a barrier through which the holes flow is low in a layer having a lower HOMO level difference between adjacent layers so that the leaked holes may more easily flow into the first patterned light-emitting layer 424P1 through the common hole transporting layer 421.

That is, the holes leaked to the first light-emitting element 400P1 are transferred to the first patterned light-emitting layer 424P1 through the patterned hole transporting layer 423. Further, the second electrode 430 is a common electrode having a common structure and has the same structure without having a separated pattern for each of the pixels P1 and P2. Therefore, even when the voltage is applied only to the second light-emitting element 400P2, the voltage is equally applied to the second electrodes 430 of the light-emitting element of all the pixels. By doing this, in the first patterned light-emitting layer 400P1, even though the voltage is not applied to the first electrode 410P1, the holes transferred through the common hole transporting layer 421 and the patterned hole transporting layer 423 and the electrons which are injected from the second electrode 430 are coupled to each other to undesirably emit first light L1.

Moreover, when the second pixel P2 is driven at a low gray scale, the brightness of the second pixel P2 which is being driven is low. Therefore, even though the first light L1 of the first pixel P1 is weakly emitted due to the leaked current, the color mixture of the light may be more easily noticed by the user/viewer. That is, at an initial time when the driving voltage applied between two electrodes 410P2 and 430 exceeds a turn-on voltage, the color mixture between adjacent pixels may be more significantly noticed. Here, the gray scale refers to the number of minimum brightness units which are represented by the light-emitting element or levels of individual units. The level is gradually increased as the driving voltage is increased from a time when the turn-on voltage is applied. Further, in this specification, a level corresponding to approximately bottom 30% of the entire gray scale of the light emitting element is referred to as a low gray scale and a level corresponding to approximately top 30% is referred to as a high gray scale.

As compared with FIG. 3A, FIG. 3B illustrates an energy band diagram illustrating flow of a hole and an electron in a structure in which the first light-emitting element 400P1 includes a functional layer 422.

Referring to FIG. 3B, in a structure in which the first light-emitting element 400P1 and the second light-emitting element 400P2 are adjacent to each other, when a voltage is applied to the first electrode 410P2 of the second light-emitting element 400P2, holes of the first electrode 410P2 are injected into the common hole transporting layer 421. In this case, some of the injected holes may be leaked to the first light-emitting element 400P1. In this case, a HOMO level EF of the functional layer 422 which is in contact between the common hole transporting layer 421 and the patterned hole transporting layer 423 of the first light-emitting layer 400P1 is lower than the HOMO level E3 of the patterned hole transporting layer 423. Therefore, the holes leaked through the common hole transporting layer 421 are suppressed from moving to the first patterned light-emitting layer 424P1.

That is, as compared with FIG. 3A, a difference between the HOMO level E3 of the common hole transporting layer 421 and the HOMO level EF of the functional layer 422 may be larger than the difference between the HOMO level E3 of the common hole transporting layer 421 and the HOMO level E3 of the patterned hole transporting layer 423 in the first light-emitting element 400P1. Therefore, as compared with the structure which does not have a functional layer 422, in the structure having a functional layer 422, the barrier through which the leaked holes flow becomes higher. Therefore, the flow of the holes into the first patterned light-emitting layer 424P1 is effectively suppressed.

In other words, when the second light-emitting element 400P2 with a higher turn-on voltage is driven, specifically, the second light-emitting element 400P2 is driven at a low gray scale, the HOMO level EF of the functional layer 422 is lower than the HOMO level E3 of the patterned hole transporting layer 423. Therefore, the holes of the second light-emitting element with a higher turn-on voltage which are leaked through the common hole transporting layer 421 may be suppressed from flowing into the first patterned light-emitting layer 424P1 or the amount of the holes which flow into the first patterned light-emitting layer 424P1 may be reduced.

Referring to FIGS. 2 and 3B, in the display device 1000 according to the exemplary embodiment of the present disclosure, the functional layer 422 included in the first light-emitting element 400P1 with a lower turn-on voltage may be in contact with the common hole transporting layer 421 and the patterned hole transporting layer 423. Further, the HOMO level EF of the functional layer 422 is lower than the HOMO level E3 of the patterned hole transporting layer 423. In other words, an absolute value of the HOMO level EF of the functional layer 422 is higher than an absolute value of the HOMO level E3 of the patterned hole transporting layer 423. Therefore, the holes leaked through the common hole transporting layer 421 may be suppressed from flowing into the first patterned light-emitting layer 424P1.

Further, the HOMO level EF of the functional layer 422 may be equal to or higher than the HOMO level E4 of the first patterned light-emitting layer 424P1 of the first light-emitting element 400P1. This will be described in detail below.

When the HOMO level EF of the functional layer 422 is lower than the HOMO level E4 of the first patterned light-emitting layer 424P1, for example, is lowered to the HOMO level E5 of the second patterned light-emitting layer 424P2 of the second light-emitting element 400P2, a difference of the HOMO level E3 of the common hole transporting layer 421 and the HOMO level E5 in the second patterned light-emitting layer 424P2 in the second light-emitting element 400P2 is substantially equal to a difference between the HOMO level E3 of the common hole transporting layer 421 and the HOMO level EF of the functional layer 422 in the first light-emitting element 400P1. That is, when the leaked holes flow into the common hole transporting layer 421, the mobility deviation of the current due to the barriers of the adjacent pixels P1 and P2 is barely noticed. Therefore, an amount of leaked current may be correspondingly minimized.

However, in the above-mentioned structure, when the first light-emitting element 400P1 is driven, that is, a voltage is applied to the first electrode 410P1 of the first light-emitting element, optical efficiency of the first light-emitting element 400P1 may be undesirably reduced. When the holes injected from the first electrode 410P1 are transferred to the first patterned light-emitting layer 424P1 through the common hole transporting layer 421, the holes which are transferred from the common hole transporting layer 421 to the first patterned light-emitting layer 424P1 through the functional layer 422 may be reduced due to the very low HOMO level of the functional layer 422. That is, the very low HOMO level of the functional layer 422 functions as a barrier which hinders the flow of the holes, so that a coupling efficiency of the hole and the electron in the first patterned light-emitting layer 424P1 may be reduced.

Therefore, when the second light-emitting element 400P2 with a higher turn-on voltage is driven, the HOMO level EF of the functional layer 422 needs to be lower than the HOMO level E3 of the patterned hole transporting layer 423 to suppress the holes leaked through the common hole transporting layer 421 from flowing (or moving) into the first patterned light-emitting layer 424P1. Further, when the first light-emitting element 400P1 with a lower turn-on voltage is driven, the HOMO level EF of the functional layer 422 needs to be equal to or higher than the HOMO level E4 of the first patterned light-emitting layer 424P1 such that the holes injected from the first electrode 410P1 pass through the functional layer 422 to be smoothly transferred to the first patterned light-emitting layer 424P1. For example, the absolute value of the HOMO level EF of the functional layer 422 may be approximately 5.0 eV (electron volts) or higher or 6.0 eV or lower, but is not necessarily limited thereto.

The functional layer 422 may be formed of the same material as a host material of the first patterned light-emitting layer 424P1 of the first light-emitting element 400P1 with a lower turn-on voltage so that the HOMO level EF of the functional layer 422 is equal to or higher than the HOMO level E4 of the first patterned light-emitting layer 424P1, but is not necessarily limited thereto.

A thickness of the functional layer 422 may be obtained by considering a micro-cavity distance between the first electrode 410P1 and the second electrode 430 of the first light-emitting element 400P1 with a lower turn-on voltage. As mentioned above, the first light-emitting element 400P1 includes the patterned hole transporting layer 423 corresponding to the first pixel P1 between the first patterned light-emitting layer 424P1 and the common hole transporting layer 421 in order to optimize the micro-cavity distance between two electrodes 410P1 and 430. Similarly to the patterned hole transporting layer 423, the functional layer 422 is a layer with a patterned structure corresponding to the first pixel P1. Therefore, a sum of the thickness of the functional layer 422 and the thickness of the patterned hole transporting layer 423 affects the distance between the first electrode 410P1 and the second electrode 430, so that the sum also affects the micro-cavity distance of the first light-emitting element 400P1. Therefore, the sum of the thickness of the functional layer 422 and the thickness of the patterned hole transporting layer 423 needs to have a thickness obtained by considering the micro-cavity distance between the first electrode 410P1 and the second electrode 430 of the first light-emitting element 400P1 with a lower turn-on voltage. For example, the thickness of the functional layer 422 may be 50 Å or higher or 300 Å or lower.

Further, as mentioned above, the turn-on voltage may be determined depending on the structure of the light-emitting unit 420 of the light-emitting element or the characteristic of the patterned light-emitting layers 424P1 and 424P2. For example, in the exemplary embodiment of the present disclosure, the first light-emitting element 400P1 with a lower turn-on voltage is an element which emits red or green light and the second light-emitting element 400P2 with a higher turn-on voltage is an element which emits blue light. That is, the first patterned light-emitting layer 424P1 may be a layer which emits red or green light and the second patterned light-emitting layer 424P2 may be a layer which emits blue light. Alternatively, the first light-emitting element 400P1 with a lower turn-on voltage of the two light-emitting elements may be an element which emits red light and the second light-emitting element 400P2 with a higher turn-on voltage may be an element which emits green or blue light. That is, the first patterned light-emitting layer 424P1 may be a layer which emits red light and the second patterned light-emitting layer 424P2 may be a layer which emits green or blue light. In other words, a turn-on voltage of the element which emits blue light may be relatively higher than that of the element which emits red light. Further, the turn-on voltage of the element which emits green light may be equal to or lower than that of the element which emits blue light in accordance with the structure of the light-emitting unit and the material property of the light-emitting layer. However, the turn-on voltage is not necessarily limited thereto, but may be determined in accordance with certain aspects of the light-emitting element such as the characteristics of the light-emitting layer.

As described above with reference to FIGS. 2 to 3B, the light-emitting element 400P1 with a lower turn-on voltage of the display device 1000 according to an exemplary embodiment of the present disclosure includes the functional layer 422. The functional layer 422 suppresses the holes of the light-emitting element 400P2 with a higher turn-on voltage which is leaked through the common layer 421 shared by two light-emitting elements 400P1 and 400P2 when the light-emitting element 400P2 with a higher turn-on voltage is driven at a low gray scale, from flowing (or moving) into the patterned light-emitting layer 424P1 of the light-emitting element 400P1 with a lower turn-on voltage. The functional layer 422 is in contact with the patterned layer 423 and the common layer 421 of the light-emitting element 400P1 with a lower turn-on voltage and has a lower HOMO level than the HOMO level of the patterned layer 423. Therefore, the leaked current of the common layer 421 which flows into the patterned light-emitting layer 424P1 of the light-emitting element 400P1 with a lower turn-on voltage is reduced. Therefore, a problem in that light is emitted from an undesired adjacent pixel may be solved and thus the color mixture problem caused thereby may be effectively solved.

Figure 4:
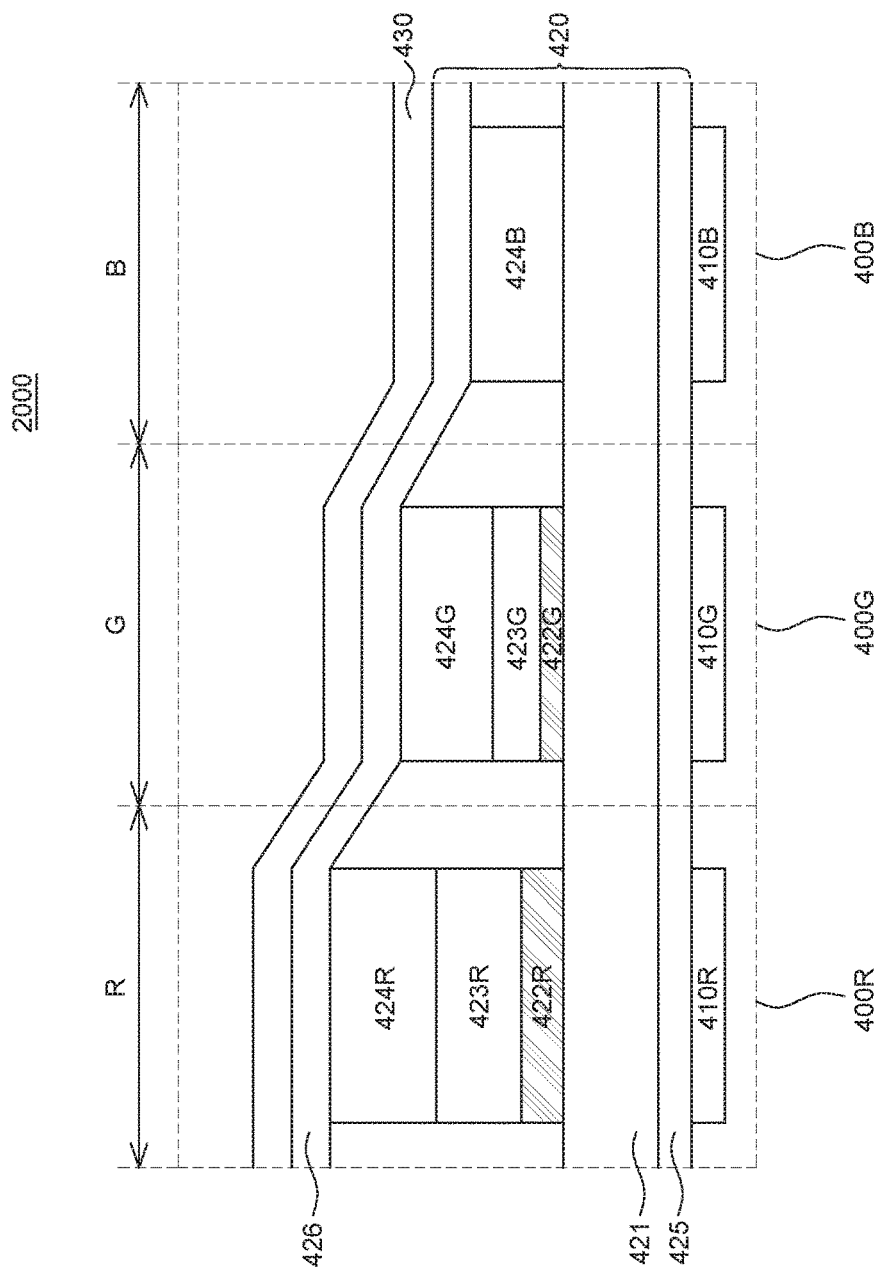
FIG. 4 is a cross-sectional view illustrating components of an organic light-emitting display device according to another exemplary embodiment of the present disclosure.

FIG. 4 is a cross-sectional view illustrating main components of an organic light-emitting display device 2000 according to another exemplary embodiment of the present disclosure. The organic light-emitting display device 2000 of FIG. 4 is provided to describe a specific application of the exemplary embodiment described with reference to FIGS. 1 to 3. Specific descriptions of components which are equal to or correspond to the exemplary embodiment described below will be omitted for the sake of convenience. Further, FIG. 4 is just one exemplary embodiment to which the technical |[Wλ|−1]concept of the above-described exemplary embodiment is specifically applied so that the present disclosure is not necessarily limited to the corresponding structure. Therefore, various structures of the organic light-emitting display device 2000 may be modified without departing from the technical scope of the present disclosure.

Referring to FIG. 4, the organic light-emitting display device 2000 includes a plurality of pixels R, G, and B which are adjacent to each other, specifically, includes a red pixel R, a green pixel G, and a blue pixel B. Three pixels R, G, and B are a minimum group which represents white light. In the organic light-emitting display device 2000, three pixels R, G, and B are repeatedly disposed to display an image.

A red light-emitting element 400R is located in the red pixel R. The red light-emitting element 400R includes a first electrode 410R, a second electrode 430R, and a light-emitting unit 420 which includes a common P type hole transporting layer 425, a common hole transporting layer 421, a functional layer 422R, a patterned hole transporting layer 423R, a red patterned light-emitting layer 424R, and a common electron transporting layer 426.

A green light-emitting element 400G is located in the green pixel G. The green light-emitting element 400G includes a first electrode 410G, a second electrode 430G, and a light-emitting unit 420 which includes a common P type hole transporting layer 425, a common hole transporting layer 421, a functional layer 422G, a patterned hole transporting layer 423G, a green patterned light-emitting layer 424G, and a common electron transporting layer 426.

A blue light-emitting element 400B is located in the blue pixel B. The blue light-emitting element 400B includes a first electrode 410B, a second electrode 430B, and a light-emitting unit 420 which includes a common P type hole transporting layer 425, a common hole transporting layer 421, a blue patterned light-emitting layer 424B, and a common electron transporting layer 426.

A plurality of first electrodes 410R, 410G, and 410B correspond to the plurality of pixels R, G, and B, respectively is disposed to be spaced apart from each other. The plurality of first electrodes 410R, 410G, and 410B are electrodes which supply holes to the light-emitting unit 420 and may be referred to as anodes or patterned electrodes.

The second electrode 430 is commonly disposed above the plurality of pixels R, G, and B and supplies the electron to the light-emitting unit 420. The second electrode 430 may be referred to as a cathode or a common electrode.

The common P type hole transporting layer 425 is a hole transporting layer on which a P type dopant is doped and functions to allow the holes to be more smoothly injected from the first electrode 410 into the light-emitting unit 420 by raising a hole mobility characteristic.

The common hole transporting layer 421 is located on the common P type hole transporting layer 425 and functions to smoothly transfer the holes injected from the first electrode 410 to the patterned light-emitting layer 424.

The common P type hole transporting layer 425 and the common hole transporting layer 421 have the common structure and extend onto the plurality of the first electrodes 410R, 410G, and 410B respectively corresponding to the red pixel R, the green pixel G, and the blue pixel B. That is, the common P type hole transporting layer 425 and the common hole transporting layer 421 are disposed to be connected or extend from one pixel to an adjacent pixel thereto without having a disconnected portion so that the layers are shared by a plurality of pixels. Therefore, the common P type hole transporting layer 425 and the common hole transporting layer 421 may be referred to as a common layer or a common structured layer.

The plurality of light-emitting elements 400R, 400G, and 400B of the organic light-emitting display device 2000 according to another exemplary embodiment of the present disclosure has a patterned light-emitting layer structure. Specifically, the plurality of patterned light-emitting layers 424R, 424G, and 424B disposed between the common layer and the second electrode 430 is configured by a patterned structure which is divided for every pixel R, G, and B.

A red patterned light-emitting layer 424R of the red pixel R emits red light and is formed of a material whose light emitting peak wavelength is approximately 600 nm or higher and 650 nm or lower.

A green patterned light-emitting layer 424G of the green pixel G emits green light and is formed of a material whose light emitting peak wavelength is approximately 510 nm or higher and 580 nm or lower.

A blue patterned light-emitting layer 424B of the blue pixel B emits blue light and is formed of a material whose light emitting peak wavelength is approximately 440 nm or higher and 480 nm or lower.

The light-emitting elements 400R, 400G, and 400B may be formed of light-emitting units 420 having different lamination structures depending on a wavelength characteristic of light emitted from the patterned light-emitting layers 424R, 424G, and 424B included therein and the material thereof.

Specifically, the light-emitting unit 420 of the red light-emitting element 400R may further include a patterned hole transporting layer 423R between the common hole transporting layer 421 and the red patterned light-emitting layer 424R in order to optimize a micro-cavity distance between the first electrode 410R and the second electrode 430. The patterned hole transporting layer 423R optimizes the micro-cavity distance of the red light-emitting element 400R and smoothly transfers the holes injected from the first electrode 410R to the red patterned light-emitting layer 424R. Similarly, the light-emitting unit 420 of the green light-emitting element 400G also includes a patterned hole transporting layer 423G to optimize the micro-cavity distance of the green light-emitting element 400G.

The micro-cavity distance may have a thickness which is proportional to a wavelength of the light emitted by the patterned light-emitting layers 424R, 424G, 424B. Therefore, as illustrated in FIG. 4, it is configured such that a thickness of the patterned hole transporting layer 423R of the red light-emitting element 400R is larger than a thickness of the patterned hole transporting layer 423G of the green light-emitting element 400G. Therefore, the micro-cavity distance of the red light-emitting element 400R and the green light-emitting element 400G may be optimized.

The blue light-emitting element 400B may also further include a patterned hole transporting layer to adjust the micro-cavity distance in accordance with the design. However, in the patterned hole transporting layer of the blue light-emitting element 400B, the light-emitting unit 420 of the blue light-emitting element 400B has a thickness corresponding to a range which is not larger than a thickness of the light-emitting unit 420 of the red or green light-emitting elements 400R and 400G. Therefore, the micro-cavity distance of each of three light-emitting elements 400R, 400G, and 400B may be optimized.

The common electron transporting layer 426 smoothly transfers the electron injected from the second electrode 430 to the patterned light-emitting layers 424R, 424G, and 424B.

The common electron transporting layer 426 has a common structure and extends onto each of the patterned light-emitting layers 424R, 424G, and 424B.

In the organic light-emitting display device 2000 according to another exemplary embodiment of the present disclosure, three light-emitting elements 400R, 400G, and 400B may have different turn-on voltages in accordance with the lamination structure of the light-emitting unit 420 of each pixel R, G, and B or the characteristics of the patterned light-emitting layers 424R, 424G, and 424B. Specifically, a turn-on voltage of the blue light-emitting element 400B is the highest and a turn-on voltage of the red light-emitting element 400R is the lowest. The turn-on voltage of the green light-emitting element 400G may be lower than the turn-on voltage of the blue light-emitting element 400B, but may be higher than the turn-on voltage of the red light-emitting element 400R. Further, in this case, a HOMO level of the blue patterned light-emitting layer 424B has the smallest value and a HOMO level of the red patterned light-emitting layer 424R has the largest value. The HOMO level of the green patterned light-emitting layer 424G may be an intermediate value between the HOMO level of the blue patterned light-emitting layer 424B and the HOMO level of the red patterned light-emitting layer 424R.

With this structure, the adjacent light-emitting elements 400R, 400G, and 400B are configured to have different turn-on voltages. Therefore, when a light-emitting element with a relatively high turn-on voltage is driven, the holes leaked by the common layer flow into the light-emitting element with a lower turn-on voltage which is adjacent thereto. As a result, the light-emitting element with a relatively low turn-on voltage may undesirably emit light.

In the organic light-emitting display device 2000 according to another exemplary embodiment of the present disclosure, the red light-emitting element 400R and the green light-emitting element 400G with relatively low turn-on voltages includes functional layers 422R and 422G. The functional layers 422R and 422G suppress the holes leaked through the common P type hole transporting layer 425 or the common hole transporting layer 421 when the blue light-emitting layer 400B with a relatively high turn-on voltage is driven, from flowing into the red patterned light-emitting layer 424R or the green patterned light-emitting layer 424G.

Specifically, referring to FIG. 4, the red light-emitting element 400R includes the functional layer 422R which is in contact between the common hole transporting layer 421 which is a common layer and the patterned hole transporting layer 423R. The functional layer 422R of the red light-emitting element 400R has a lower HOMO level than that of the patterned hole transporting layer 423R. Therefore, the holes of the blue light-emitting element 400B which are leaked through the common layer and flow into the red patterned light-emitting layer 424R of the red light-emitting element 400R may be reduced. Further, a sum of the thicknesses of the functional layer 422R and the patterned hole transporting layer 423R may have a thickness at which the micro-cavity distance of the red light-emitting element 400R is optimized, that is, a thickness obtained by considering a peak wavelength of light emitted by the red patterned light-emitting layer 424R. For example, the functional layer 422R has a thickness of 100 Å or larger and 300 Å or smaller. Therefore, the micro-cavity distance of the red light-emitting element 400R is optimized and the flow of the leaked holes may be suppressed. Further, the HOMO level of the functional layer 422R of the red light-emitting element 400R is equal to or higher than the HOMO level of the red patterned light-emitting layer 424R. Therefore, when a voltage is applied to the first electrode 410R of the red light-emitting element 400R, the hole injected from the first electrode 410R more smoothly passes through the functional layer 422R to be supplied to the red patterned light-emitting layer 424R. Therefore, reduction of the optical efficiency of the red light-emitting element 400R may be minimized. The functional layer 422R of the red light-emitting element 400R may be formed of the same material as a host material of the red patterned light-emitting layer 424R.

Similarly, the green light-emitting element 400G includes the functional layer 422G which is in contact between the common hole transporting layer 421 and the patterned hole transporting layer 423G. The functional layer 422G of the green light-emitting element 400G has a lower HOMO level than that of the patterned hole transporting layer 423G. Therefore, the holes of the blue light-emitting element 400B which are leaked through the common layer and flow into the green patterned light-emitting layer 424G of the green light-emitting element 400G may be reduced. Further, a sum of the thicknesses of the functional layer 422G and the patterned hole transporting layer 423G may have a thickness at which the micro-cavity distance of the green light-emitting element 400G is optimized, that is, a thickness obtained by considering a peak wavelength of light emitted by the green patterned light-emitting layer 424G. For example, the functional layer 422G has a thickness of 50 Å or larger and 250 Å or smaller. Therefore, the micro-cavity distance of the green light-emitting element 400G is optimized and the flow of the leaked holes may be suppressed. Further, the HOMO level of the functional layer 422G of the green light-emitting element 400G is equal to or higher than the HOMO level of the green patterned light-emitting layer 424G. Therefore, when a voltage is applied to the first electrode 410G of the green light-emitting element 400G, the holes injected from the first electrode 410G more smoothly pass through the functional layer 422G to be supplied to the green patterned light-emitting layer 424G. Therefore, reduction of the optical efficiency of the green light-emitting element 400G may be minimized. The functional layer 422G of the green light-emitting element 400G may be formed of the same material as a host material of the green patterned light-emitting layer 424G.

As described above, in the organic light-emitting display device 2000 according to another exemplary embodiment of the present disclosure, when there is a difference between turn-on voltages of adjacent pixels, it is configured such that a light-emitting element with a lower turn-on voltage includes a functional layer having the above-described feature. Therefore, a problem in that when the pixel with a higher turn-on voltage is driven, the current is leaked through the common layer so that the light is also emitted from the pixel with a lower turn-on voltage may be solved.

Here, when two objects, for example, two light-emitting elements or two pixels are adjacent to each other, two objects may be in directly contact with each other or two objects with different turn-on voltages may be spaced apart from each other with a predetermined distance. For example, in FIG. 4, the red pixel R and the green pixel G or the green pixel G and the blue pixel B are configured to have relatively different turn-on voltages and to be in contact with each other. Further, the red pixel R and the blue pixel B are configured to have different turn-on voltages. Even though the red pixel R and the blue pixel B are not in contact with each other, the red pixel R and the blue pixel B are disposed to be adjacent to each other. More specifically, when two objects are included in one group and are in contact with each other or spaced apart from each other with a predetermined distance, the holes leaked through the common layer may be more effectively suppressed from flowing into an undesired place.

Figure 5A:
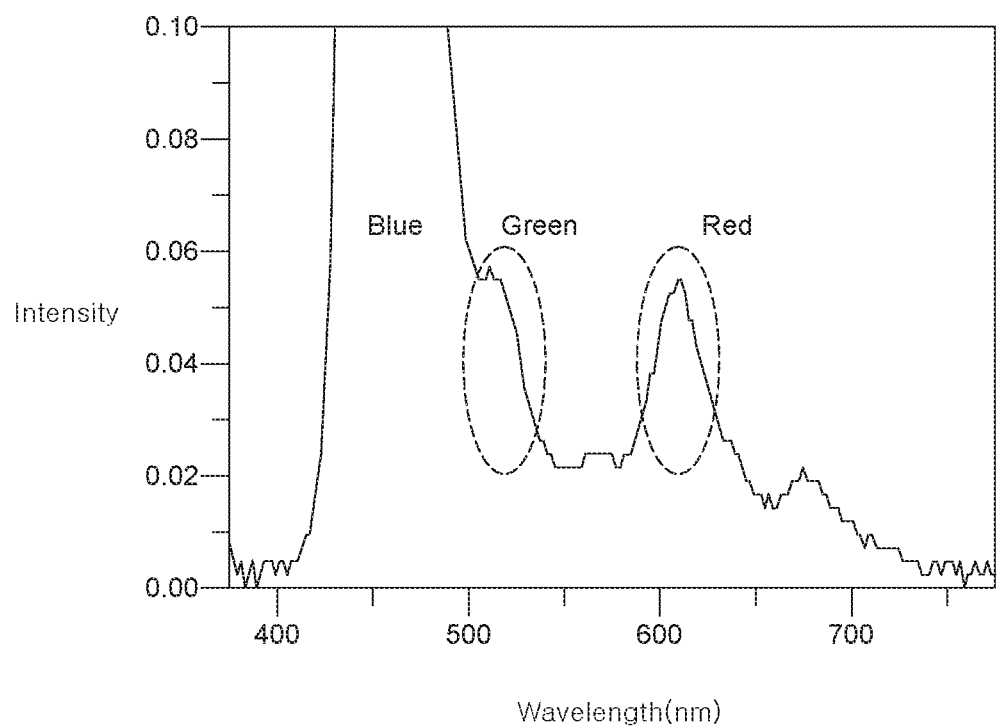
FIGS. 5A and 5B are graphs illustrating an optical spectrum according to a comparative embodiment and an exemplary embodiment of the present disclosure.
Figure 5B:
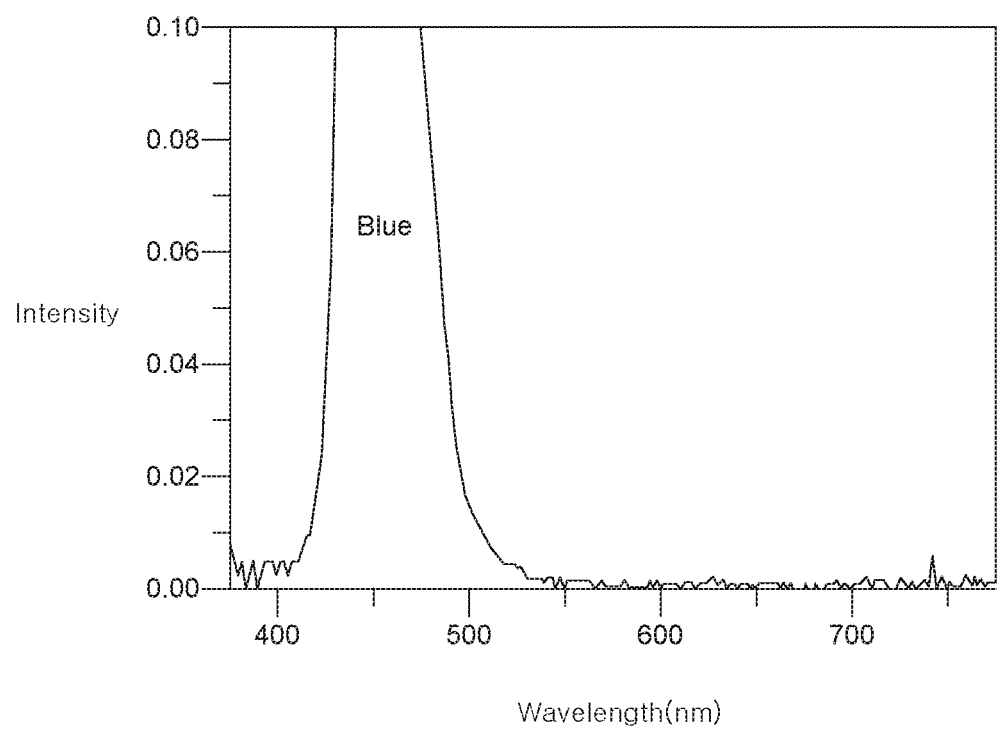

FIGS. 5A and 5B are graphs illustrating an optical spectrum according to a comparative embodiment and an exemplary embodiment of the present disclosure.

FIG. 5A illustrates a structure of a comparative embodiment. Specifically, FIG. 5A illustrates an optical spectrum when a voltage is applied to the blue light-emitting element 400B in a structure in which the red light-emitting element 400R and the green light-emitting element 400G of the organic light-emitting display device 2000 illustrated in FIG. do not include the functional layers 422R and 422G. Referring to FIG. 5A, it is confirmed that an intensity of the light is the highest at a wavelength (approximately, 440 nm to 480 nm) corresponding to blue light when a voltage which is equal to or higher than the turn-on voltage is applied to the blue light-emitting element 400B. In this case, it is understood that the intensity of the light is increased at a wavelength (approximately, 510 nm to 540 nm) corresponding to the green light and a wavelength (approximately, 600 nm to 640 nm) corresponding to the red light other than the wavelength corresponding to the blue light. That is, it is understood that when the voltage is applied to the blue light-emitting element to emit blue light, undesired green and red light are also emitted by the leaked current, which results in color mixture of the light between adjacent pixels.

On the contrary, FIG. 5B illustrates an optical spectrum when the same voltage as the comparative embodiment is applied to the blue light-emitting element 400B in a structure of the embodiment, specifically, a structure of the organic light-emitting display device 2000 including the functional layers 422R and 422G illustrated in FIG. 4. Referring to FIG. 5B, it is understood that when the voltage is applied to the blue light-emitting element 400B, the intensity of the light is the highest at a wavelength (approximately, 440 nm to 480 nm) corresponding to the blue light and the intensity of the light corresponding to wavelength other than the wavelength corresponding to the blue light is not increased. Here, the intensity of the light is denoted by a particular unit measure (e.g. an arbitrary unit, A.U.) which compares relative intensities of light. That is, when a voltage is applied to the blue light-emitting element to emit blue light, the functional layers included in the red light-emitting element and the green light-emitting element suppress the current leaked to the common layer from flowing (moving) into the red patterned light-emitting layer or the green patterned light-emitting layer. Therefore, it is confirmed that the problem in that the adjacent pixels undesirably emits light is solved, through experiments.

Figure 6B:
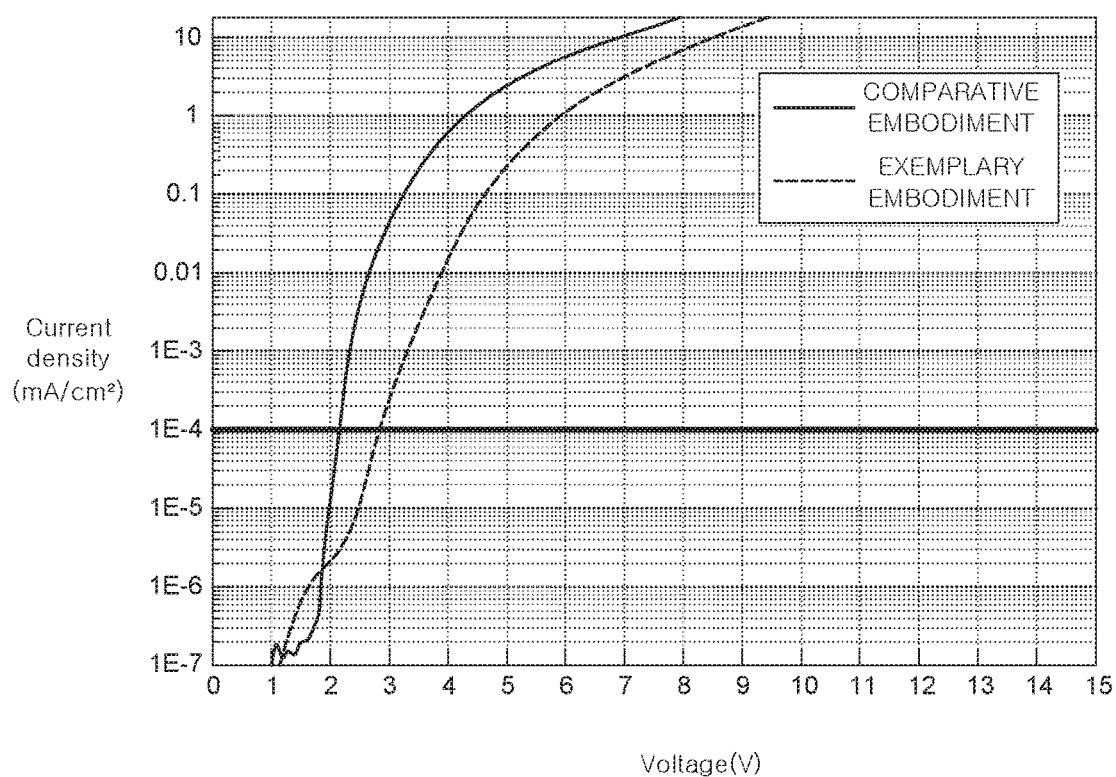

FIGS. 6A and 6B are a table and a graph illustrating a turn-on voltage according to a comparative embodiment and an exemplary embodiment of the present disclosure. Specifically, FIG. 6A is a table illustrating a measured value of the turn-on voltage of the structures of the comparative embodiment and the exemplary embodiment. FIG. 6B illustrates an I-V graph of the structures of the comparative embodiment and the exemplary embodiment.

The structure of the comparative embodiment is a structure in that the red light-emitting element 400R of the organic light-emitting display device 2000 illustrated in FIG. does not include the functional layer 422R. FIG. 6B illustrates the I-V graph when the voltage is applied to the red light-emitting element of the comparative embodiment. Referring to FIGS. 6A and 6B, in the structure of the comparative embodiment, when the current intensity is $10^{-4}$ mA/cm$^2$, the voltage value is 2.07 V. Here, $10^{-4}$ mA/cm$^2$ of the current intensity is a current intensity value at a timing defined that light is emitted from one pixel. In this case, the voltage value may be considered as the turn-on voltage of the pixel. That is, as illustrated in FIGS. 6A and 6B, a turn-on voltage of the red light-emitting element which does not include a functional layer is 2.07 V.

The structure of the exemplary embodiment is a structure in which the red light-emitting element 400R of the organic light-emitting display device 2000 illustrated in FIG. includes the functional layer 422R. Specifically, the thickness of the functional layer 422R is 200 Å. FIG. 6B illustrates an I-V graph when a voltage is applied to the red light-emitting element of the exemplary embodiment. Referring to FIGS. 6A and 6B, in the structure of the exemplary embodiment, when the current intensity is $10^{-4}$ mA/cm$^2$, the voltage value is 2.87 V. That is, it is confirmed that the turn-on voltage of the red light-emitting element in the structure of the exemplary embodiment is 2.87 V and the turn-on voltage is increased by 0.8 V as compared with the structure of the comparative embodiment, through experiments.

Referring to FIGS. 6A and 6B, it is understood that when the red light-emitting element includes a functional layer, the turn-on voltage of the red light-emitting element is increased. As described above, the HOMO level of the functional layer is lower than the HOMO level of the patterned layer which is in contact with the functional layer. Therefore, the holes of the common layer are suppressed from passing through the functional layer to flow into the red patterned light-emitting layer. In other words, in a structure which does not have a functional layer, as described with reference to FIG. 3A, the difference between the HOMO level of the common layer and the HOMO level of the patterned layer is hardly generated. Therefore, the hole of the common layer easily passes through the patterned layer to be transferred to the red patterned light-emitting layer. However, in a structure which includes a functional layer, as described with reference to FIG. 3B, the difference between the HOMO level of the common layer and the HOMO level of the functional layer is higher than the difference between the HOMO level of the common layer and the HOMO level of the patterned layer. Therefore, the barrier through which the hole of the common layer passes through the functional layer becomes higher. Therefore, the holes which pass through the functional layer to be injected into the red patterned light-emitting layer may be reduced. Therefore, in order to allow the holes of the common layer to pass through the high barrier of the functional layer, a high voltage needs to be applied. Therefore, the turn-on voltage of the red light-emitting element which includes a functional layer is increased as compared with the red light-emitting element with a structure which does not have a functional layer.

Therefore, the turn-on voltage of the light-emitting element (for example, the red light-emitting element) with a lower turn-on voltage is higher than the lower turn-on voltage of the light-emitting element with the structure which does not include the functional layer. Further, the increased turn-on voltage is lower than the turn-on voltage of the light-emitting element (for example, the blue light-emitting element) with a higher turn-on voltage. That is, the light-emitting element with a lower turn-on voltage includes a functional layer, so that even though the turn-on voltage is lower than the turn-on voltage of the light-emitting element with a higher turn-on voltage, the turn-on voltage is increased to a predetermined level as compared with the structure without a functional layer. Therefore, the holes flowing into the common layer may not be easily transferred to the patterned light-emitting layer.

As described above, a light-emitting element with a lower turn-on voltage of the two light-emitting elements includes a functional layer which suppresses holes of a light emitting element with a higher turn-on voltage from being leaked through a common layer to flow (or move) into the patterned light-emitting element with a lower turn-on voltage. Therefore, color mixture problem in that adjacent pixels undesirably emit light may be reduced. Therefore, the exemplary embodiment of the present disclosure may contribute to improving the display quality of the display device.

The exemplary embodiments of the present disclosure can also be described as follows:

According to an aspect of the present disclosure, a display device includes two light-emitting elements with different turn-on voltages. Each of two light-emitting elements includes a patterned electrode, a common layer, a patterned light-emitting layer, and a common electrode. A light-emitting element with a lower turn-on voltage of the two light-emitting elements includes a functional layer which suppresses holes from being leaked from a light-emitting layer with a higher turn-on voltage through the common layer when the light-emitting element with a higher turn-on voltage of the two light-emitting elements is driven at a low gray scale to move into the patterned light-emitting layer of the light-emitting element with a lower turn-on voltage. Therefore, the emission of an undesired pixel due to the leaked current is reduced, so that the display quality may be improved.

The light-emitting element with a lower turn-on voltage may further include a patterned layer between the common layer and the patterned light-emitting layer and the functional layer is in contact with the common layer and the patterned layer.

A HOMO level of the functional layer may be lower than a HOMO level of the patterned layer.

The HOMO level of the functional layer may be equal to or higher than a HOMO level of the patterned light-emitting layer of the light-emitting element with a lower turn-on voltage.

The functional layer may be formed of the same material as a host material of the patterned light-emitting layer of the light-emitting element with a lower turn-on voltage.

An absolute value of the HOMO level of the functional layer may be 5.0 eV or higher and 6.0 eV or lower.

The turn-on voltage of the light-emitting element with a lower turn-on voltage may be increased to be higher than the turn-on voltage of the light-emitting element with a lower turn-on voltage which does not have a functional layer and the increased turn-on voltage may be lower than the turn-on voltage of the light-emitting element with a higher turn-on voltage.

A sum of a thickness of the patterned layer and a thickness of the functional layer may be a thickness obtained by considering a micro-cavity distance between the patterned electrode and the common electrode of the light-emitting element with a lower turn-on voltage.

The thickness of the functional layer may be 50 Å or higher and 300 Å or lower.

The patterned layer and the common layer may be hole transporting layers which are formed of the same material.

The light-emitting element with a lower turn-on voltage may be an element which emits red or green light and the light-emitting element with a higher turn-on voltage is a light-emitting element which emits blue light.

The light-emitting element with a lower turn-on voltage may be an element which emits red light and the light-emitting element with a higher turn-on voltage may be a light-emitting element which emits green or blue light.

According to another aspect of the present disclosure, an organic light-emitting display device including a first pixel and a second pixel which are adjacent to each other includes a plurality of first electrodes which corresponds to the first pixel and the second pixel and is disposed to be spaced apart from each other, a common hole transporting layer which extends onto the plurality of first electrodes, a first patterned light-emitting layer which is located on the common hole transporting layer corresponding to the first pixel, a second patterned light-emitting layer which is located on the common hole transporting layer corresponding to the second pixel and has a HOMO level lower than that of the first patterned light-emitting layer, a patterned hole transporting layer which is located between the common hole transporting layer and the first patterned light-emitting layer corresponding to the first pixel, a functional layer which is located between the patterned hole transporting layer and the first patterned light-emitting layer corresponding to the first pixel and has a HOMO level lower than that of the patterned hole transporting layer, and a second electrode located on the first patterned light-emitting layer and the second patterned light-emitting layer. According to another aspect of the present disclosure, the organic light-emitting display device is configured to include the functional layer having a lower HOMO level than the first patterned light-emitting layer, so that the color mixture between adjacent pixels due to leaked current may be resolved.

A HOMO level of the functional layer may be equal to or higher than a HOMO level of the first patterned light-emitting layer.

The functional layer may be formed of the same material as a host material of the first patterned light-emitting layer.

An absolute value of the HOMO level of the functional layer may be 5.0 eV or higher and 6.0 eV or lower.

A thickness of the functional layer may be 50 Å or higher and 300 Å or lower.

The patterned hole transporting layer and the common hole transporting layer may be formed of the same material.

The first patterned light-emitting layer may be a layer which emits red or green light and the second patterned light-emitting layer is a layer which emits blue light.

The first patterned light-emitting layer may be a layer which emits red light and the second patterned light-emitting layer is a layer which emits green or blue light.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
two light-emitting elements with different turn-on voltages,
wherein the two light-emitting elements respectively include a patterned electrode, a common layer, a patterned light-emitting layer, and a common electrode, and
wherein the light-emitting element with a lower turn-on voltage among the two light-emitting elements includes a functional layer configured to suppress holes from being leaked from the light-emitting layer with a higher turn-on voltage through the common layer and from moving into the patterned light-emitting layer of the light-emitting element with the lower turn-on voltage, when the light-emitting element with the higher turn-on voltage among the two light-emitting elements is driven at a low gray scale.

2. The display device according to claim 1, wherein the light-emitting element with the lower turn-on voltage further includes a patterned layer between the common layer and the patterned light-emitting layer, and the functional layer is in contact with the common layer and the patterned layer.

3. The display device according to claim 2, wherein a highest occupied molecular orbital (HOMO) level of the functional layer is lower than a HOMO level of the patterned layer.

4. The display device according to claim 3, wherein the HOMO level of the functional layer is equal to or higher than a HOMO level of the patterned light-emitting layer of the light-emitting element with the lower turn-on voltage.

5. The display device according to claim 4, wherein the functional layer is formed of the same material as a host material of the patterned light-emitting layer of the light-emitting element with the lower turn-on voltage.

6. The display device according to claim 5, wherein an absolute value of the HOMO level of the functional layer is 5.0 eV or higher and 6.0 eV or lower.

7. The display device according to claim 6, wherein the turn-on voltage of the light-emitting element with the lower turn-on voltage is increased to be higher than the turn-on voltage of the light-emitting element having the lower turn-on voltage which does not have the functional layer and the increased turn-on voltage is lower than the turn-on voltage of the light-emitting element having a higher turn-on voltage.

8. The display device according to claim 5, wherein a sum of a thickness of the patterned layer and a thickness of the functional layer is a total thickness determined by a microcavity distance between the patterned electrode and the common electrode of the light-emitting element with the lower turn-on voltage.

9. The display device according to claim 8, wherein the thickness of the functional layer is between 50 Å and 300 Å.

10. The display device according to claim 9, wherein the patterned layer and the common layer are hole transporting layers which are formed of the same material.

11. The display device according to claim 5, wherein the light-emitting element with the lower turn-on voltage is an element which emits red or green light and the light-emitting element with the higher turn-on voltage is a light-emitting element which emits blue light.

12. The display device according to claim 5, wherein the light-emitting element with the lower turn-on voltage is an element which emits red light and the light-emitting element with the higher turn-on voltage is a light-emitting element which emits green or blue light.

13. An organic light-emitting display device including a first pixel and a second pixel which are adjacent to each other, the organic light-emitting display device comprising:
first electrodes corresponding to the first pixel and the second pixel, and spaced apart from each other;
a common hole transporting layer extending onto the first electrodes;
a first patterned light-emitting layer on the common hole transporting layer corresponding to the first pixel;
a second patterned light-emitting layer on the common hole transporting layer corresponding to the second pixel with a highest occupied molecular orbital (HOMO) level lower than that of the first patterned light-emitting layer;
a patterned hole transporting layer between the common hole transporting layer and the first patterned light-emitting layer corresponding to the first pixel;
a functional layer between the patterned hole transporting layer and the first patterned light-emitting layer corresponding to the first pixel with a HOMO level lower than that of the patterned hole transporting layer; and
a second electrode on the first patterned light-emitting layer and the second patterned light-emitting layer.

14. The organic light-emitting display device according to claim 13, wherein the functional layer is configured to have a HOMO level that is equal to or higher than a HOMO level of the first patterned light-emitting layer.

15. The organic light-emitting display device according to claim 14, wherein the functional layer is formed of the same material as a host material of the first patterned light-emitting layer.

16. The organic light-emitting display device according to claim 15, wherein an absolute value of the HOMO level of the functional layer is 5.0 eV or higher and 6.0 eV or lower.

17. The organic light-emitting display device according to claim 16, wherein a thickness of the functional layer is between 50 Å and 300 Å.

18. The organic light-emitting display device according to claim 17, wherein the patterned hole transporting layer and the common hole transporting layer are formed of the same material.

19. The organic light-emitting display device according to claim 18, wherein the first patterned light-emitting layer is a layer which emits red or green light and the second patterned light-emitting layer is a layer which emits blue light.

20. The organic light-emitting display device according to claim 18, wherein the first patterned light-emitting layer is a layer which emits red light and the second patterned light-emitting layer is a layer which emits green or blue light.

* * * * *